US011670390B2

United States Patent
Ball et al.

(10) Patent No.: US 11,670,390 B2
(45) Date of Patent: Jun. 6, 2023

(54) RE-PROGRAMMABLE INTEGRATED CIRCUIT ARCHITECTURE AND METHOD OF MANUFACTURE

(71) Applicant: TEXAS INSTRUMENTS INCORPORATED, Dallas, TX (US)

(72) Inventors: Michael Allen Ball, Richardson, TX (US); Anand Seshadri, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/488,008

(22) Filed: Sep. 28, 2021

(65) Prior Publication Data
US 2023/0116065 A1     Apr. 13, 2023

(51) Int. Cl.
*G11C 17/18*     (2006.01)
*G11C 17/16*     (2006.01)

(52) U.S. Cl.
CPC ............ *G11C 17/165* (2013.01); *G11C 17/18* (2013.01)

(58) Field of Classification Search
CPC ..................................................... G11C 17/18
USPC ............................................................ 365/96
See application file for complete search history.

(56) References Cited

U.S. PATENT DOCUMENTS

| 2015/0262701 A1* | 9/2015 | Takizawa | G11C 11/1659 |
| | | | 365/96 |
| 2016/0093398 A1* | 3/2016 | Choi | G11C 11/5685 |
| | | | 365/100 |
| 2017/0242660 A1* | 8/2017 | Katoh | G11C 13/0007 |

* cited by examiner

*Primary Examiner* — Muna A Techane
(74) *Attorney, Agent, or Firm* — Andrew R. Ralston; Frank D. Cimino

(57) ABSTRACT

A re-programmable integrated circuit (IC) includes a plurality of non-volatile memory elements, each including a fuse portion initially configured to have either a first resistance value or a second resistance value. Re-programming circuitry includes a controllable element coupled to each fuse portion and selectively operable to cause an electrical current to flow through the fuse portion sufficient to cause that fuse portion to transition to an altered state having a resistance value greater than the first and second resistance values. Reference resistance circuitry is configurable between an initial state and a re-programmed state. Read circuitry determines the logic state of each of the memory elements using a comparator circuit operable to sense the resistance value of a fuse portion and the reference resistance, whether in the initial or re-programmed state, wherein the logic state of a memory element is a function of whether the resistance value of the fuse portion is greater than or less than the reference resistance.

22 Claims, 4 Drawing Sheets

| | BEFORE UPDATE | AFTER UPDATE |
|---|---|---|
| SILICIDED FUSE RESISTANCE ~ $R_{LOW}$ | DATA "0" | DATA "0" |
| UNSILICIDED FUSE RESISTANCE ~ $R_{MID}$ | DATA "1" | DATA "0" |
| ALTERED FUSE RESISTANCE ~ $R_{HIGH}$ | N/A | DATA "1" |

FIG. 1

| FUSE STATES | REFERENCE | |
|---|---|---|
| "0" = 100-200Ω (SILICIDED) | 500Ω | INITIAL STATES |
| "1" = 1K-2KΩ (UNSILICIDED) | 500Ω | |
| "0" = 100-200Ω (SILICIDED) | 10KΩ | RE-PROGRAMMED STATES |
| "0" = 1K-2KΩ (UNSILICIDED) | 10KΩ | |
| "1" > 50KΩ | 10KΩ | |

FIG. 4

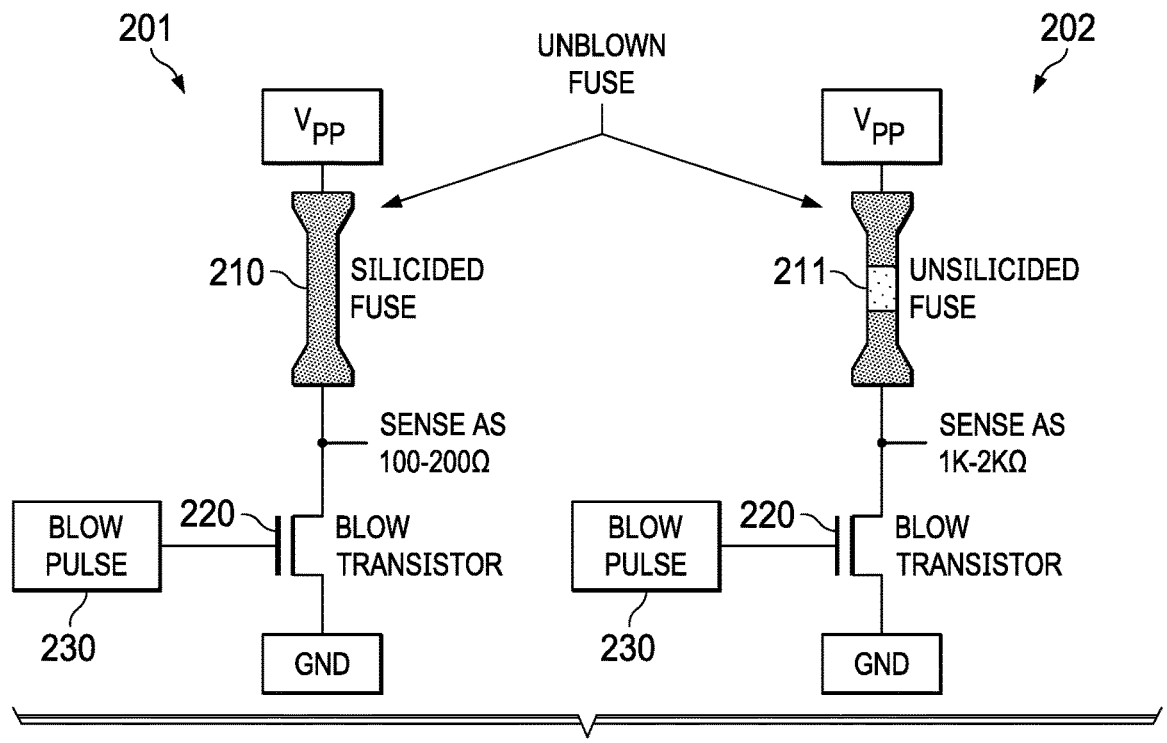
FIG. 2-A
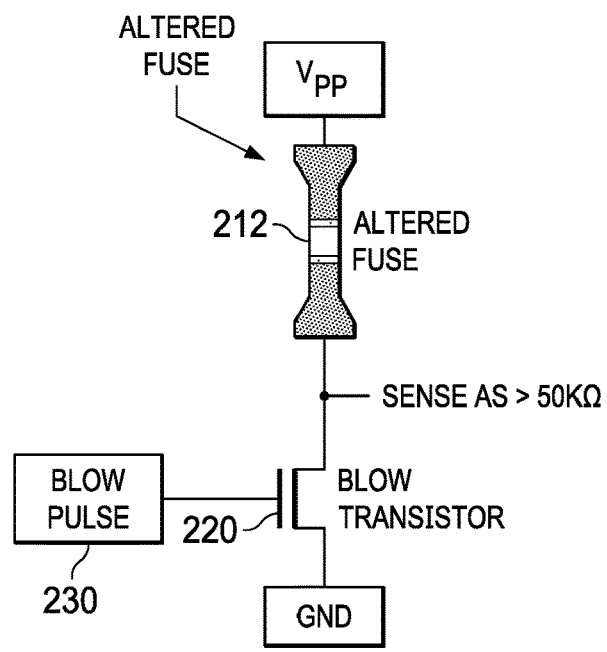
FIG. 2-B

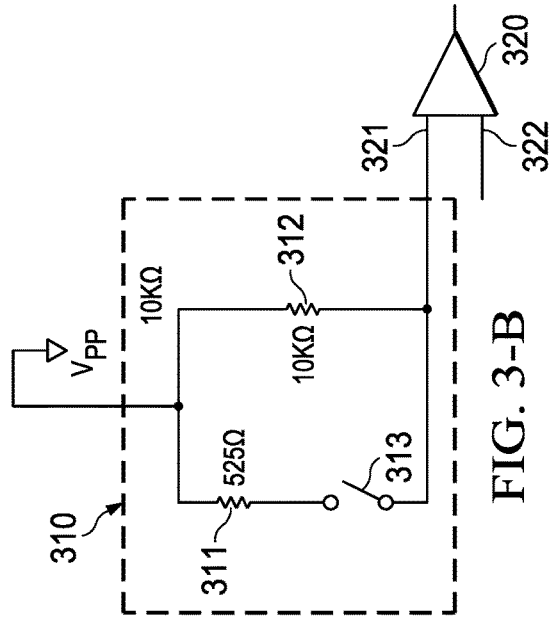
FIG. 3-A
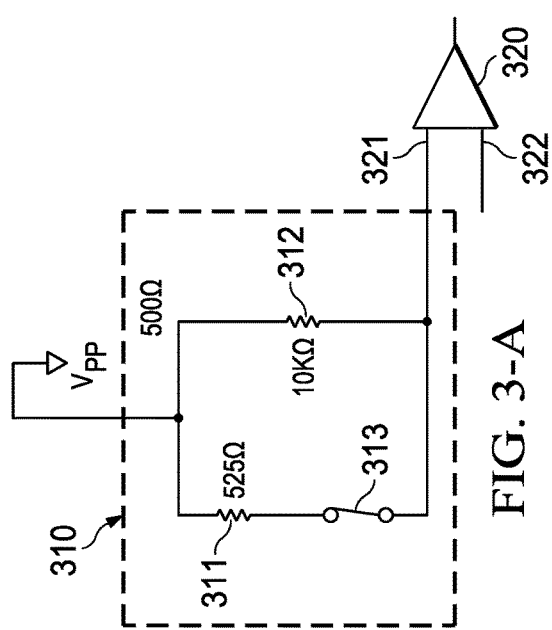
FIG. 3-B
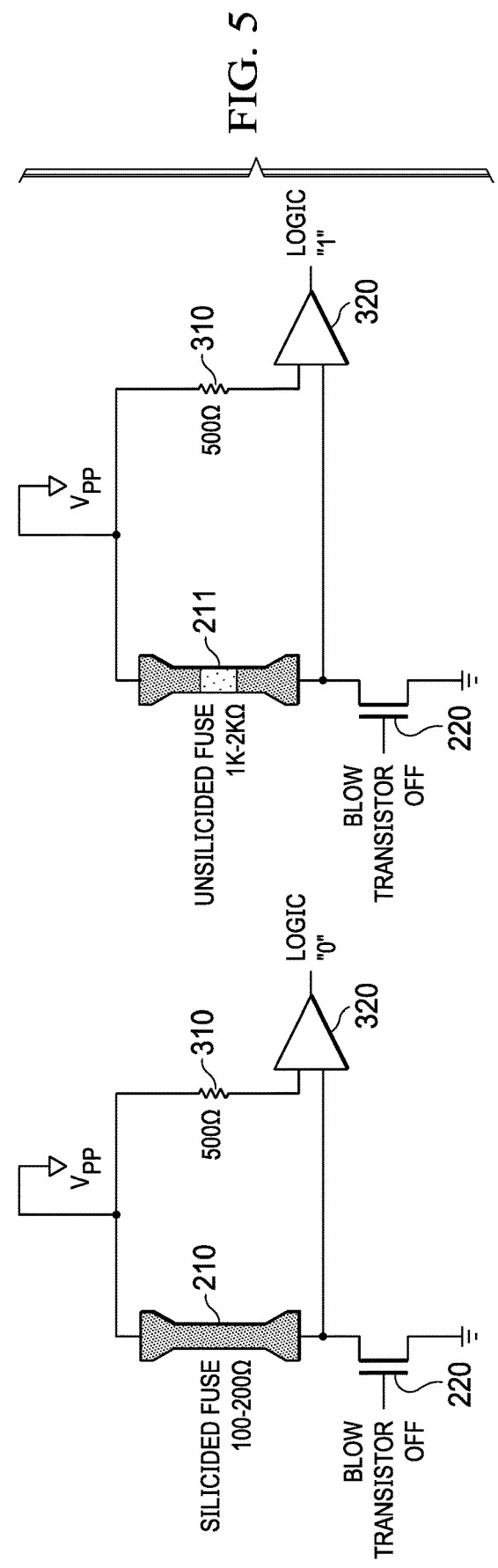
FIG. 5

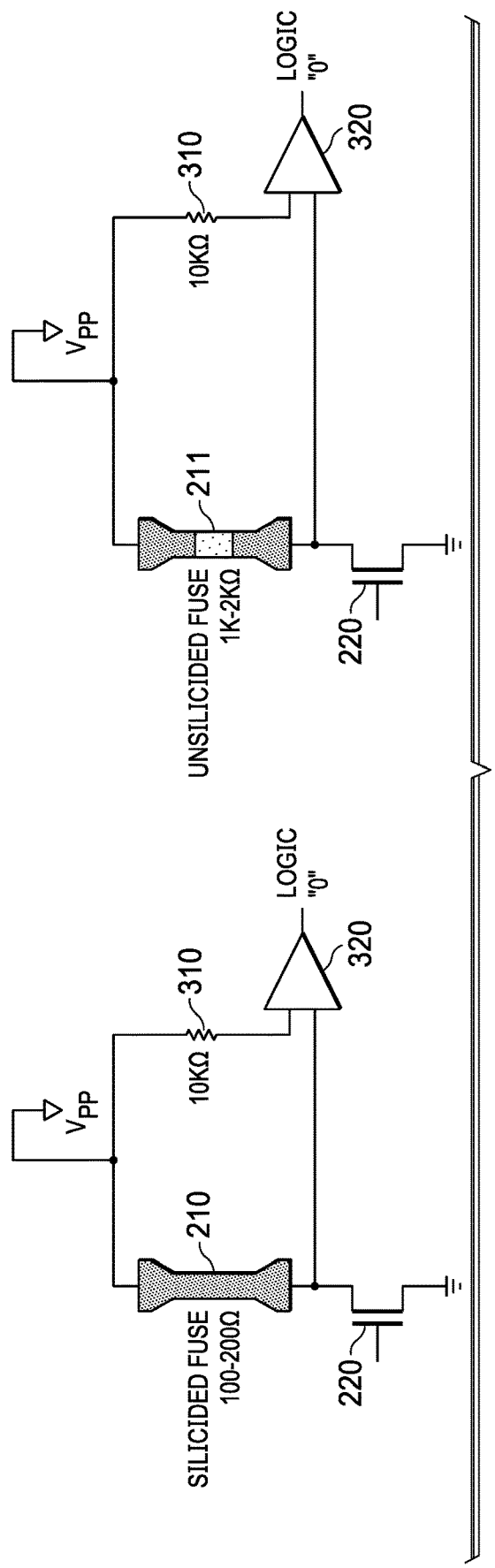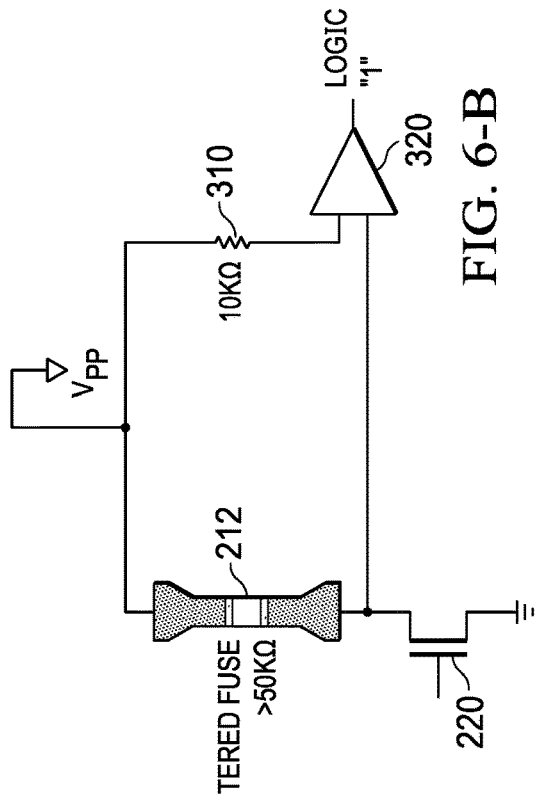
FIG. 6-A
FIG. 6-B

RE-PROGRAMMABLE INTEGRATED CIRCUIT ARCHITECTURE AND METHOD OF MANUFACTURE

TECHNICAL FIELD

The disclosure is directed, in general, to integrated circuits and, more specifically, to integrated circuits having re-programmable non-volatile memory elements.

BACKGROUND

An integrated circuit (IC) is a set of electronic circuits on a small piece of semiconductor material, usually silicon. One type of IC is a read-only memory (ROM), which is a form of non-volatile memory (NVM) wherein the logical state of each bit (or memory element), either a "0" or "1", is fixed; data stored in ROM cannot be electronically modified after manufacture. A mask ROM is a read-only memory having contents that are programmed by the IC manufacturer, rather than the end user; the desired contents of the memory are typically provided to the manufacturer, which is converted into a custom mask layer for the final metallization on interconnections on the memory chip. An alternative to a mask ROM is a programmable ROM (PROM), which allows for programming after manufacture. A typical PROM is manufactured with all memory elements, or bits, reading as "1"; during programming, "burning" (i.e., rupturing) a fuse associated with a memory element causes it to change to a state that will, instead, be read as "0". Rupturing a fuse associated with a memory element, however, is irreversible; therefore, such PROMs can only be programmed once. During product development, however, it is common to use a rewritable NVM, such as an electrically erasable programmable read-only memory (EEPROM), which has memory elements that can be repeatedly erased and re-programmed.

The main advantage of mask ROM is cost. Per bit, mask ROM is significantly more compact than other types of semiconductor memory; because the cost of an IC is proportional to its size and number of masking steps, mask ROM is therefore substantially cheaper than other forms of memory. One disadvantage, however, are masking costs; such costs are high and there is a long turn-around time from design to production. If an error in the data is identified, a mask ROM must be reproduced to correct the error, leading to more costs. Thus, ROMs tend to be used only for large production runs with well-verified data, while PROMs or EEPROMs are typically used during the design phase. What is needed in the art, therefore, is a non-volatile memory that combines the advantages of ROMs and PROMs.

SUMMARY

In order to address the deficiencies of the prior art, disclosed hereinafter is a re-programmable integrated circuit (IC) architecture and method of manufacture thereof. The disclosed re-programmable IC is characterized by an initial mask-programmed state for each memory element, each of which can be subsequently re-programmed. The re-programmable IC architecture includes a plurality of non-volatile memory elements, each including an electrically conductive fuse portion initially configured to have either a first resistance value or a second resistance value when in an initial state. Each resistance value can be associated with different logic states. For example, the first initial programmed state can correspond to a logic "0" and the second initial programmed state then corresponds to a logic "1", or vice versa. Re-programming circuitry includes a controllable element coupled to the fuse portion of each memory element; the controllable element is selectively operable to cause an electrical current to flow through the fuse portion sufficient to cause that fuse portion to transition to an altered state having a resistance value greater than the first and second resistance values. To differentiate the re-programmed state of each memory element, reference resistance circuitry includes a reference selection switch configurable between an initial programmed state and a re-programmed state; the switch is configured in the initial state prior to altering the programmed state of the memory elements and in the re-programmed state after altering the initial programmed state of any memory elements. The resistance of the reference resistance circuitry is a first value when the reference selection switch is in the initial programmed state and a second value when in the re-programmed state. Read circuitry determines the logic state of each of the memory elements using a comparator circuit operable to sense the resistance value of the electrically conductive fuse portion of a memory element and the reference resistance; the logic state of a memory element is a function of whether the resistance value of the memory element is greater than or less than the reference resistance.

In an example, each electrically conductive fuse portion of a memory element having a first resistance value is formed as a silicided polycrystalline silicon; the resistance value for such fuses can be, for example, in the range of 100-200 Ω. Similarly, each electrically conductive fuse portion having a second resistance value is formed as an unsilicided polycrystalline silicon; the resistance value for such fuses can be, for example, in the range of 1000-2000 Ω. The controllable element coupled to the fuse portion of each memory element is preferably a transistor suitably sized to source the current necessary to alter the fuse portion, causing it to have a greater resistance value that can be differentiated from the lower resistance values of both the silicided and unsilicided polycrystalline silicon fuses; in some instances, the altered state can correspond to the fuse portion being substantially ruptured.

In an example, the reference resistance circuitry includes a first reference resistance in series with the reference switch, the first reference resistance and reference switch in parallel with a second reference resistance; the reference resistance is the parallel-equivalent resistance of the first and second reference resistances as a function of the state of the reference switch. The first reference resistance has a value intermediate to the first and second resistance values of the electrically conductive fuse portions of the memory elements when in an initial state; the second reference resistance has a value greater than both the first and second resistance values of the electrically conductive fuse portions of the memory elements when in an initial state, but less than the resistance of the reference resistance circuitry when in the re-programmed state.

The foregoing has outlined, rather broadly, the principles of the disclosed examples so that those skilled in the art may better understand the detailed description of the example implementations that follow. Those skilled in the art should appreciate that they can readily use the disclosed conception and examples as a basis for designing or modifying other structures and methods for carrying out the same purposes or effects of the disclosed examples. Those skilled in the art should also realize that such equivalent constructions do not depart from the spirit and scope of the claims in their broadest form.

BRIEF DESCRIPTION OF THE DRAWINGS

For a more complete understanding of the disclosed implementations, reference is made to the following detailed description taken in conjunction with the accompanying drawings, in which:

FIG. 1 illustrates the logical states of fuses forming a portion of a non-volatile memory element, prior and subsequent to re-programming, according to the principles of the disclosure;

FIG. 2-A illustrates first and second types of non-volatile memory elements, in an initial programmed state, and re-programming circuitry for selectively altering the initial programmed state;

FIG. 2-B illustrates a non-volatile memory element, whether of the first or second type illustrated in FIG. 2-A, subsequent to re-programming;

FIG. 3-A illustrates example reference resistance circuitry, prior to re-programming, and read circuitry for use in differentiating the logical states of the non-volatile memory elements illustrated in FIG. 2-A;

FIG. 3-B illustrates example reference resistance circuitry, subsequent to re-programming, for use in differentiating the logical states of non-volatile memory elements illustrated in FIGS. 2-A and 2-B, FIG. 4 illustrates the potential logical states of each non-volatile memory element and an example reference resistance value for use in differentiating the logical states of non-volatile memory elements prior and subsequent to re-programming;

FIG. 5 illustrates the first and second types of non-volatile memory elements shown in FIG. 2-A, combined with the reference resistance and read circuitry illustrated in FIG. 3-A, for corresponding first and second initial programmed states; and, FIG. 6-A illustrates the first and second types of non-volatile memory elements illustrated in FIG. 2-A, combined with the reference resistance and read circuitry illustrated in FIG. 3-B, subsequent to re-programming when an associated fuse has not been altered; and, FIG. 6-B illustrates both types of non-volatile memory elements illustrated in FIG. 2-A, combined with the reference resistance and read circuitry illustrated in FIG. 3-B, subsequent to re-programming when an associated fuse has been altered.

DETAILED DESCRIPTION

The disclosed re-programmable IC is characterized, first, by memory elements each having a fuse portion which, during manufacture, are formed to have either a first resistance value or a second resistance value when in an initial state. In an example, the fuses are formed as either silicided or unsilicided polycrystalline silicon. Silicide (e.g., nickel silicide, $Ni_2Si$) formation occurs by default on poly and source/drain implanted silicon. To prevent silicide from forming, a stacked blocking layer of oxide and nitride can be patterned with a silicide blocking mask, and etched, to keep the blocking layer. $Ni_2Si$, therefore, does not form in those areas of poly (and silicon) that are covered by the blocking layer. In an example, a silicided polycrystalline silicon fuse is formed such that it has a resistance in the range of 100-200 $\Omega$ and an unsilicided polycrystalline silicon fuse has a resistance in the range of 1-2 k$\Omega$. After being altered, due to re-programming, each type of fuse has a greater resistance; in the examples, the resistance after re-programming is preferably greater than 50 k$\Omega$, but the altered state can correspond to a fuse portion being substantially ruptured and having a significantly higher resistance. Alternatives to the described silicide process to produce fuses having either a first resistance value or a second resistance value when in an initial state include any process which can yield fuses having resistances of sufficient difference in their initial states to be distinguishable from the reference resistance, and altered to a third resistance value (greater than the first and second resistance values) when re-programmed.

Referring to FIG. 1, illustrated are example logical states of fuses forming a portion of a non-volatile memory element, prior and subsequent to re-programming, according to the principles of the disclosure. Prior to re-programming (also referred to as "updating"), which relies on rupturing a fuse, a silicided fuse has a resistance ($R_{LOW}$) which is less than the resistance of an unsilicided fuse ($R_{MID}$). Subsequent to re-programming, which alters (e.g., partially or fully open circuits) a fuse, the resistance of both types of fuses increases ($R_{HIGH}$). The different resistance states provide the foundation for a scheme to differentiate logic states, wherein $R_{LOW}$ and $R_{MID}$ can correspond to logical "0" and "1", respectively, prior to re-programming; after re-programming, both $R_{LOW}$ and $R_{MID}$ can correspond to logical "0", while $R_{HIGH}$ can correspond to logical "1". Those skilled in the art will recognize that the logical states assigned to the resistance values can be reversed, both prior to and subsequent to re-programming, if desired in a particular implementation.

Referring now to FIG. 2-A, illustrated are first and second types of non-volatile memory elements, in an initial programmed state, and re-programming circuitry for selectively altering the initial programmed state; the first type is characterized by a silicided polycrystalline fuse 210 and the second type by an unsilicided polycrystalline fuse 211. As described supra, a silicide blocking layer (SIBLK) is utilized during manufacturer to prevent the formation of silicide in fuse 211, except possibly in locations at which a conductive via may make contact to the fuse 211. The fuses 210 and 211 illustrate a configuration sometimes referred to as a "dog-bone", in which a central narrow portion is located between two wider end portions at which contact may be made to an interconnect circuit. Because the current density in the central portion will be higher than the end portions, the central portion is the operative portion of the fuse structure, and is sometimes referred to as the "electrically conductive fuse portion" herein and in the claims.

Re-programming circuitry for altering the initial programmed state of each non-volatile memory element is coupled to each fuse; in the example, the re-programming circuitry includes a "blow" transistor 220 coupled in series with each fuse; the opposite end of each fuse is coupled to a voltage source ($V_{PP}$) and the source of each blow transistor is coupled to ground (GND). The re-programming circuitry further includes blow pulse circuitry 230 coupled to the gate of each transistor; the blow pulse circuitry is selectively operative to turn blow transistor 220 on to cause an electrical current to flow through the fuse portion that is sufficient to cause it to transition to a substantially altered state having a higher resistance. FIG. 2-B illustrates a non-volatile memory element, whether of the first or second type illustrated in FIG. 2-A, subsequent to re-programming; e.g., subsequent to applying a blow pulse to the gate of transistor 220, resulting in an altered fuse 212.

As noted supra, according to the examples illustrated in FIG. 2-A, a silicided polycrystalline silicon fuse is formed such that it has a resistance in the range of 100-200 $\Omega$ and an unsilicided polycrystalline silicon fuse has a resistance in the range of 1-2 kΩ; after being altered, due to re-programming, each type of fuse has a substantially greater resistance, preferably greater than 50 kΩ, as illustrated in FIG. 2-B. To differentiate between those resistance values, and assigned logical states, example reference resistance circuitry and read circuitry are illustrated in FIGS. 3-A and 3-B.

Referring to FIG. 3-A, illustrated is example reference resistance circuitry 310, prior to re-programming, and read circuitry 320 for use in differentiating the logical states of the non-volatile memory elements illustrated in FIG. 2-A. The reference resistance circuitry includes a reference selection switch 313 configured in an initial programmed state (e.g., closed) in series with a first reference resistance 311; the first reference resistance 311 and reference switch 313 are in parallel with a second reference resistance 312. Because the reference resistance switch 313 is closed, the total resistance of the reference resistance circuitry 310 is the parallel-equivalent resistance of the first and second reference resistances 311 and 312, respectively. Referring now to FIG. 3-B, illustrated is example reference resistance circuitry 310 subsequent to re-programming. Unlike the initial programmed state illustrated in FIG. 3-A, the reference selection switch 313 is configured in a re-programmed state (e.g., open); because the reference resistance switch 313 is open, the total resistance of the reference resistance circuitry 310 is equal to the second reference resistance 312.

A first terminal of reference resistance circuitry 310 is coupled to voltage source $V_{PP}$ and the second terminal is coupled to a first input 321 of read circuitry 320; a second input 322 of read circuitry 320 is coupled intermediate to the fuse portion and "blow" transistor 220 of a memory element, as illustrated in and described hereinafter with respect to FIGS. 5, 6-A and 6-B. The read circuitry 320 can be any circuit suitable for differentiating between the sensed resistance of a memory element fuse coupled to input 322 and the resistance of the reference resistance circuitry 310 coupled to input 321, wherein the logic state of a memory element is a function of whether the resistance value of the memory element fuse is greater than or less than the reference resistance; an example is a conventional sense amplifier.

In order to distinguish the logical states of the memory elements, appropriate values for the first and second resistances 311, 312 of the reference resistance circuitry 310 must be selected. In the example scheme, the resistance value for reference resistance circuitry 310 is intermediate to those resistance values when in the initial programmed state and greater than both values when in the re-programmed state; e.g., the resistance value for reference resistance circuitry 310 in the initial state is approximately 500 Ω and in the re-programmed state is 10 kΩ, which can be realized if resistance 311 has a value of 525 Ω and resistance 312 has a value of 10 kΩ.

FIG. 4 summarizes logical states of each non-volatile memory element according to the example silicided and unsilicided fuse resistance values and example reference resistance values. In the initial programmed state, when the resistance value of reference resistance circuitry 310 is equal to 500 Ω (FIG. 3-A), a logical state of "0" corresponds to a silicided fuse having a resistance of 100-200 Ω and a logical state of "1" corresponds to an unsilicided fuse having a resistance value of 1-2 kΩ. In the re-programmed state, when the resistance value of reference resistance circuitry 310 is equal to 10 kΩ (FIG. 3-B), a logical state of "0" corresponds to both a silicided fuse having a resistance of 100-200 Ω and an unsilicided fuse having a resistance of 1-2 kΩ, and a logical state of "1" corresponds to either type of fuse which has been altered during the re-programming process.

Reference is now made to FIG. 5, which illustrates the first and second types of non-volatile memory elements shown in FIG. 2-A, combined with the reference resistance circuitry 310 and read circuitry 320 illustrated in FIG. 3-A, for corresponding first and second initial programmed states. With the reference resistance circuitry 310 configured to have a resistance value of 500 Ω (e.g., reference selection switch 313 is closed as illustrated in FIG. 3-A), the output of read circuitry 320 is a logic "0" for memory elements having a silicided fuse 210 and a logic "1" for memory elements having an unsilicided fuse 211.

Finally, reference is made to FIGS. 6-A and 6-B, which illustrate the logic states subsequent to re-programming when the reference selection switch 313 is open as illustrated in FIG. 3-B. As seen in FIG. 6-A, for both an unaltered silicide fuse 210 and unaltered unsilicided fuse 211, the output of read circuitry 320 is a logic "0". In FIG. 6-B, an altered fuse 212, whether initially a silicided fuse 210 or unsilicided fuse 211, causes the read circuitry 320 to output a logic "1". In summary, with the reference resistance circuitry 310 configured to have a resistance value of 10 kΩ subsequent to re-programming any memory elements (e.g., resistance selection switch 313 is open), the output of read circuitry 320 is a logic "0" for memory elements having resistance values less than 10 kΩ, regardless of whether a memory element has a silicided fuse 210 or unsilicided fuse 211, and a logic "1" for memory elements having a resistance value greater than 10 kΩ (e.g., for any memory element having a fuse, whether silicided or unsilicided, which was altered during reprogramming).

The technical principles disclosed herein provide a foundation for designing re-programmable ICs having a mask-programmed initial state. The examples presented herein illustrate the application of the technical principles and are not intended to be exhaustive or to be limited to the specifically-disclosed applications; it is only intended that the scope of the technical principles be defined by the claims appended hereto, and their equivalents.

We claim:

1. A re-programmable integrated circuit, comprising:
a plurality of non-volatile memory elements, each memory element including an electrically conductive fuse portion in an initial state, the initial state being either a first initial state having a first resistance value or a second initial state having a second resistance value;
re-programming circuitry for altering the state of each of said non-volatile memory elements, said re-programming circuitry including a controllable element coupled to the fuse portion of each memory element, each said controllable element selectively operable to cause an electrical current to flow through said fuse portion sufficient to cause that fuse portion to transition to an altered state having a third resistance value greater than said first and second resistance values;
reference resistance circuitry comprising a reference selection switch configurable between an initial programmed state and a re-programmed state, said reference selection switch configured in said initial programmed state prior to altering the programmed state of each of said non-volatile memory elements and in said re-programmed state after altering the initial programmed state of any of said non-volatile memory elements, wherein a reference resistance of said reference resistance circuitry is a first reference value when said reference selection switch is in said initial programmed state and a second reference value when said reference selection switch is in said re-programmed state; and, read circuitry for determining the logic state of each of said non-volatile memory elements, said read circuitry comprising a comparator circuit operable to sense the resistance value of the electrically conductive fuse portion of a memory element and said reference resistance, wherein the logic state of a memory element is a function of whether the resistance value of the memory element is greater than or less than said reference resistance.

2. The integrated circuit recited in claim 1, wherein each electrically conductive fuse portion having said first resistance value comprises silicided polycrystalline silicon.

3. The integrated circuit recited in claim 2, wherein said first resistance value is in a range of 100-200 Ω.

4. The integrated circuit recited in claim 2, wherein each electrically conductive fuse portion having said second resistance value comprises unsilicided polycrystalline silicon.

5. The integrated circuit recited in claim 4, wherein said second resistance value is in a range of 1000-2000 Ω.

6. The integrated circuit recited in claim 1, wherein said controllable element coupled to the fuse portion of each memory element comprises a transistor.

7. The integrated circuit recited in claim 1, wherein said reference resistance circuitry comprises a first reference resistance in series with said reference selection switch, said first reference resistance and said reference selection switch in parallel with a second reference resistance, wherein the reference resistance is a parallel-equivalent resistance of said first and second reference resistances as a function of the state of said reference selection switch.

8. The integrated circuit recited in claim 7, wherein said first reference resistance has a value intermediate to said first resistance value and said second resistance value of said electrically conductive fuse portion of a memory element when in said initial state.

9. The integrated circuit recited in claim 7, wherein said second reference resistance has a value greater than both said first resistance value and said second resistance value of the electrically conductive fuse portions of the memory elements in said initial state, but less than said third resistance value corresponding to said altered state.

10. The integrated circuit recited in claim 1, wherein said first initial programmed state corresponds to a logic "0" and said second initial programmed state corresponds to a logic "1".

11. The integrated circuit recited in claim 1, wherein said altered state corresponds to said fuse portion being substantially ruptured.

12. A method for producing a re-programmable integrated circuit, said method comprising the steps of:

forming, on a silicon substrate, a plurality of non-volatile memory elements, wherein each memory element includes an electrically conductive fuse portion configured to have either a first resistance value or a second resistance value, said first resistance value corresponding to a first initial programmed state and said second resistance value corresponding to a second initial programmed state;

forming, on said substrate, re-programming circuitry for altering the initial programmed state of each of said non-volatile memory elements, said re-programming circuitry including a controllable element coupled to the fuse portion of each memory element, each said controllable element selectively operable to cause an electrical current to flow through said fuse portion sufficient to cause that fuse portion to transition to a substantially altered state having a third resistance value greater than said first and second resistance values;

forming, on said substrate, reference resistance circuitry comprising a reference selection switch configurable between an initial programmed state and a re-programmed state, said reference selection switch configured in said initial programmed state prior to altering the programmed state of each of said non-volatile memory elements and in said re-programmed state after altering the initial programmed state of any of said non-volatile memory elements, wherein a reference resistance of said reference resistance circuitry is a first reference value when said reference selection switch is in said initial programmed state and a second reference value when said reference selection switch is in said re-programmed state; and, forming, on said substrate, read circuitry for determining the logic state of each of said non-volatile memory elements, said read circuitry comprising a comparator circuit operable to sense the resistance value of the electrically conductive fuse portion of a memory element and said reference resistance, wherein the logic state of a memory element is a function of whether the resistance value of the memory element is greater than or less than said reference resistance.

13. The method recited in claim 12, wherein each electrically conductive fuse portion having said first resistance value comprises a silicided polycrystalline silicon.

14. The method recited in claim 13, wherein said first resistance value is in a range of 100-200 Ω.

15. The method recited in claim 13, wherein each electrically conductive fuse portion having said second resistance value comprises an unsilicided polycrystalline silicon.

16. The method recited in claim 15, wherein said second resistance value is in a range of 1000-2000 Ω.

17. The method recited in claim 12, wherein said controllable element coupled to the fuse portion of each memory element comprises a transistor.

18. The method recited in claim 12, wherein said reference resistance circuitry comprises a first reference resistance in series with said reference selection switch, said first reference resistance and said reference selection switch in parallel with a second reference resistance, wherein the reference resistance is a parallel-equivalent resistance of said first and second reference resistances as a function of the state of said reference selection switch.

19. The method recited in claim 18, wherein said first reference resistance has a value intermediate to said first resistance value and said second resistance value of said electrically conductive fuse portion of a memory element when in said initial programmed state.

20. The method recited in claim 18, wherein said second reference resistance has a value greater than both said first resistance value and said second resistance value of the electrically conductive fuse portions of the memory elements in said initial programmed state, but less than said third resistance value corresponding to said altered state.

21. The method recited in claim 12, wherein said first initial programmed state corresponds to a logic "0" and said second initial programmed state corresponds to a logic "1".

22. The method recited in claim 12, wherein said altered state corresponds to said fuse portion being substantially ruptured.

\* \* \* \* \*